(12) United States Patent
McCullough et al.

(10) Patent No.: US 6,543,524 B2
(45) Date of Patent: Apr. 8, 2003

(54) OVERPLATED THERMALLY CONDUCTIVE PART WITH EMI SHIELDING

(75) Inventors: Kevin A. McCullough, Warwick, RI (US); E. Mikhail Sagal, Watertown, MA (US); James D. Miller, Marietta, GA (US)

(73) Assignee: Cool Options, Inc., Warwick, RI (US)

( * ) Notice: Subject to any disclaimer, the term of this patent is extended or adjusted under 35 U.S.C. 154(b) by 0 days.

(21) Appl. No.: 09/886,629

(22) Filed: Jun. 21, 2001

(65) Prior Publication Data

US 2002/0062950 A1 May 30, 2002

Related U.S. Application Data

(62) Division of application No. 09/726,142, filed on Nov. 29, 2000.

(51) Int. Cl.[7] .................................................. F28F 13/18
(52) U.S. Cl. ........................ 165/133; 165/185; 165/905; 257/746
(58) Field of Search ................................. 165/133, 185; 257/746, 766; 428/318.8, 327, 361, 357

(56) References Cited

U.S. PATENT DOCUMENTS

| 1,802,695 A | * | 4/1931 | Bennett ........................ 165/133 |
| 3,990,862 A | * | 11/1976 | Dahl et al. ................... 165/133 |
| 4,390,581 A | * | 6/1983 | Cogswell et al. .............. 428/71 |
| 4,714,623 A | * | 12/1987 | Riccio et al. .................. 427/34 |
| 4,782,893 A | * | 11/1988 | Thomas ........................ 165/185 |
| 5,268,414 A | * | 12/1993 | Nakai et al. .................. 524/539 |
| 5,660,917 A | * | 8/1997 | Fujimori et al. ............. 428/195 |
| 5,952,417 A | * | 9/1999 | Chao et al. ................... 524/451 |
| 5,962,348 A | * | 10/1999 | Bootle et al. ............... 165/80.3 |
| 6,058,013 A | * | 5/2000 | Christopher et al. ......... 361/704 |
| 6,248,289 B1 | * | 6/2001 | Schneider ....................... 419/5 |
| 6,031,719 A1 | * | 2/2002 | Schmitt et al. .............. 361/695 |
| 6,385,047 B1 | * | 5/2002 | McCullough et al. ........ 165/185 |

* cited by examiner

Primary Examiner—Henry Bennett
Assistant Examiner—Terrell McKinnon
(74) Attorney, Agent, or Firm—Barlow, Josephs & Holmes, Ltd.

(57) ABSTRACT

A net-shape molded heat transfer component is provided which includes a thermally conductive core and a metallic coating for reflection of electromagnetic interference and radio frequency waves. The heat transfer component is formed by net-shape molding a core body from a thermally conductive composition, such as a polymer composition, and applying a metallic coating. The molded heat transfer part is freely convecting through the part, which makes it more efficient and has an optimal thermal configuration. Additionally, the part is shielded from electromagnetic interference and radio frequency waves, thus preventing the transfer of same into the circuitry housed by the part. In addition, the coating also seals the conductive polymer core against moisture infiltration, making the part well suited for telecommunications applications in potentially harsh environments.

8 Claims, 3 Drawing Sheets

OVERPLATED THERMALLY CONDUCTIVE PART WITH EMI SHIELDING

This application is a divisional application of co-pending application Ser. No. 09/726,142, filed Nov. 29, 2000.

BACKGROUND OF THE INVENTION

The present invention relates generally to the dissipation of heat from heat generating surfaces and objects. More specifically, the present invention relates to apparatuses for dissipating heat generated by such objects. In addition, the present invention relates to passively conducting heat away from heat generating objects by use of thermally conductive composite materials while further shielding the device from electromagnetic interference (EMI).

In industry, there are various parts and components that generate heat during operation. For example, in the electronics and communications industries, it is well known that integrated circuit components generate heat during operation. Various types of electronic device packages containing integrated circuit chips, such as satellite dishes, are such devices that generate heat. Often these devices contain integrated circuit systems with a tightly packed configuration that requires all of the components to be installed in close proximity to one another. These integrated circuit devices, particularly the main processor chips, generate a great deal of heat during operation which must be removed to prevent adverse effects on operation of the system into which the device is installed. For example, the operational section of a satellite dish, containing many integrated circuit components, is highly susceptible to overheating which could destroy the device itself or cause the components within the device to malfunction.

There are a number of prior art methods to cool heat generating components and objects to avoid device failure and overheating, as discussed above. Since the space available within these devices is generally quite limited the heat must be conducted away from the heat-generating component for dissipation at the periphery of the device. In these cases, a heat-conducting device is commonly placed into communication with the heat generating surface at one end and a heat sink at the other to dissipate the heat therefrom. Such a heat-conducting device is typically constructed from a metal casing that is charged with a conductive gas and serves primarily as a conductor with little heat-dissipating characteristic, therefore requiring the inclusion of a heat sink device in the cooling system. A heat sink typically includes a base member with a number of individual cooling members, such as fins, posts or pins, to assist in the dissipation of heat and may be incorporated into the case of the heat generating device. The geometry of the cooling members is designed to improve the amount of surface area of the heat sink that contacts the ambient air for optimal heat dissipation. The use of such fins, posts or other surface area increasing methods, in an optimal geometrical configuration greatly enhances heat dissipation compared to devices with no such additional cooling members, such as a flat heat spreader.

To further enhance airflow and resultant heat dissipation, fans and devices have been used, either internally or externally. However, these external devices consume power and have numerous moving parts. As a result, heat sink assemblies with active devices are subject to failure and are much less reliable than a device that is solely passive in nature.

It has been discovered that more efficient cooling of electronics can be obtained through the use of passive devices that require no external power source and contain no moving parts. It is very common in the electronics industry to have many electronic devices grouped on a single circuit board, such as a motherboard, modem, or "processor card" such as the Celeron board manufactured by Intel Corporation. For example, video cards, which are capable of processing millions of polygons per second, are also susceptible to overheating and need efficient and effective cooling, as do the CPUs discussed above. Video cards typically have at least one chip thereon that runs extremely hot to necessitate a cooling system designed to operate within small clearances.

In the heat transfer industries, it has been well known to employ metallic materials for thermal conductivity applications, such as heat dissipation for cooling integrated circuit device packages. For these applications, such as device casings operating as heat sinks, the metallic material typically is tooled or machined from bulk metals into the desired configuration. However, such metallic conductive articles are typically very heavy, costly to machine and are susceptible to corrosion. Further, the use of metallic materials commonly creates electromagnetic interference (EMI), which often detracts from the performance of the device on which the heat sink is affixed. Finally, the geometries of machined metallic heat dissipating articles are very limited to the inherent limitations associated with the machining or tooling process. As a result, the requirement of use of metallic materials which are machined into the desired form, place severe limitations on heat sink and heat conductor design particular when it is known that certain geometries, simply by virtue of their design, would realize better efficiency but are not attainable due to the limitations in machining metallic articles. To compensate for these limitations, active cooling, such as by powered fans, must be employed to achieve the requisite cooling to prevent device failure.

It is widely known in the prior art that improving the overall geometry of a heat-dissipating article can greatly enhance the overall performance of the article even if the material employed is the same. Therefore, the need for improved heat sink geometries necessitated an alternative to the machining of bulk metallic materials. To meet this need, attempts have been made in the prior art to provide molded compositions that include conductive filler material therein to provide the necessary thermal conductivity. The ability to mold a conductive composite enabled the design of more complex part geometries to realize improved performance of the part.

However, a drawback in the thermally conductive molded polymer compositions, loaded with metallic reinforcing materials such as copper flakes, is that they inherently absorb EMI and radio frequency waves. As a result of their absorptive characteristics these materials effectively operate as antennas absorbing EMI that could potentially interfere with the operation of the device into which they have been incorporated. As a result, the use of these conductive polymers in devices such as satellite components and receiver equipment is undesirable.

In view of the foregoing, there is a demand for a heat dissipation assembly that is thermally conductive and capable of dissipating heat. There is a demand for a passive heat dissipation assembly with no moving parts that can provide heat dissipation without the use of active components. In addition, there is a demand for a complete heat sink assembly that can provide greatly enhanced heat dissipation over prior art passive devices with improved heat sink geometry. There is a demand for a heat sink assembly that can provide thermal conductivity and dissipation in a compact configuration. There is a further demand for a net-shape molded heat dissipation assembly that does not absorb EMI and is well suited for use in harsh environments.

SUMMARY OF THE INVENTION

The present invention employs the advantages of prior art heat transfer and dissipation devices. In addition, it provides new advantages not found in currently available devices and overcomes many disadvantages of such currently available devices.

The invention is generally directed to a novel and unique, molded thermally conductive component part that is net-shape moldable from a thermally conductive polymer composition. The part of the present invention also includes a coating of EMI reflective material. The present invention relates to a molded heat dissipating part that conducts heat from a heat-generating source, such as an integrated circuit component or electronic components on a computer circuit board, such as the operational section of a satellite dish.

The molded heat dissipation part of the present invention has many advantages over prior art in that it is injection molded from the thermally conductive polymer materials that enables the part to be made in complex geometries. These complex geometries enable the heat conductive and dissipative components of the part to be optimized to be more efficient thus transferring and dissipating more heat. As a result, the molded part is freely convecting throughout, making the part more efficient. The ability to injection mold the heat dissipation part permits the optimal configuration to be realized and achieved. Since the part is net-shape molded, valuable and costly fabrication time will be saved. Parts can be fabricated that, although complex in shape, require no additional tooling, shaping or machining steps to reach the final configuration. Parts can be designed in virtually any shape to be installed within tight clearances allowing the most efficient layout of heat generating components while still allowing heat to be conducted to the periphery of the device for effective dissipation. The present molded heat dissipation part can be designed to what is thermally efficient while allowing the device to be designed in the most efficient manner without the limitations imposed by the manufacturing and mechanical limitations of the prior art processes, such as brazing.

Another important feature of the new heat dissipating part is its ability to reflect EMI and RF waves. This is particularly important in a satellite dish environment, which is very EMI sensitive. Since the moldable conductive polymer inherently absorbs EMI and RF waves, there is a danger that this interference will be conducted back into the circuitry from which the heat is being dissipated. This interference is often problematic and prevents the device from functioning properly. To prevent the parts from absorbing EMI and RF, the part of the present invention is covered with a metallic coating to effectively reflect the EMI and RF waves and avoid the unwanted interference often encountered in telecommunications applications. A coating of nickel-copper is a preferred coating and would serve the additional function of sealing the conductive polymer against water infiltration. This would protect the device for use in potentially harsh environments similar to those in which a great deal of telecommunications equipment is currently installed.

It is therefore an object of the present invention to provide a heat-dissipating device that can provide enhanced heat dissipation for a heat generating component or object.

It is an object of the present invention to provide a heat-dissipating device that can provide heat dissipation for integrated circuit devices, such as a satellite dish or telecommunications equipment.

It is a further object of the present invention to provide a heat-dissipating device that has no moving parts.

Another object of the present invention is to provide a heat-dissipating device that is completely passive and does not consume power.

A further object of the present invention is to provide a heat dissipation device that is inexpensive to manufacture.

Another object of the present invention is to provide a heat dissipation device that has a thermal conductivity greater that conventional heat sink designs.

An object of the present invention is to provide a heat transfer part that is net-shape moldable and can be configured into complex geometries to allow optimal integrated circuit configuration.

Yet another object of the present invention is to provide a molded heat transfer part that is shielded from absorption of electromagnetic interference and radio frequency waves.

BRIEF DESCRIPTION OF THE DRAWINGS

The novel features which are characteristic of the present invention are set forth in the appended claims. However, the invention's preferred embodiments, will be best understood by reference to the following detailed description taken in connection with the accompanying drawings in which:

DETAILED DESCRIPTION OF THE INVENTION

Figure 1:
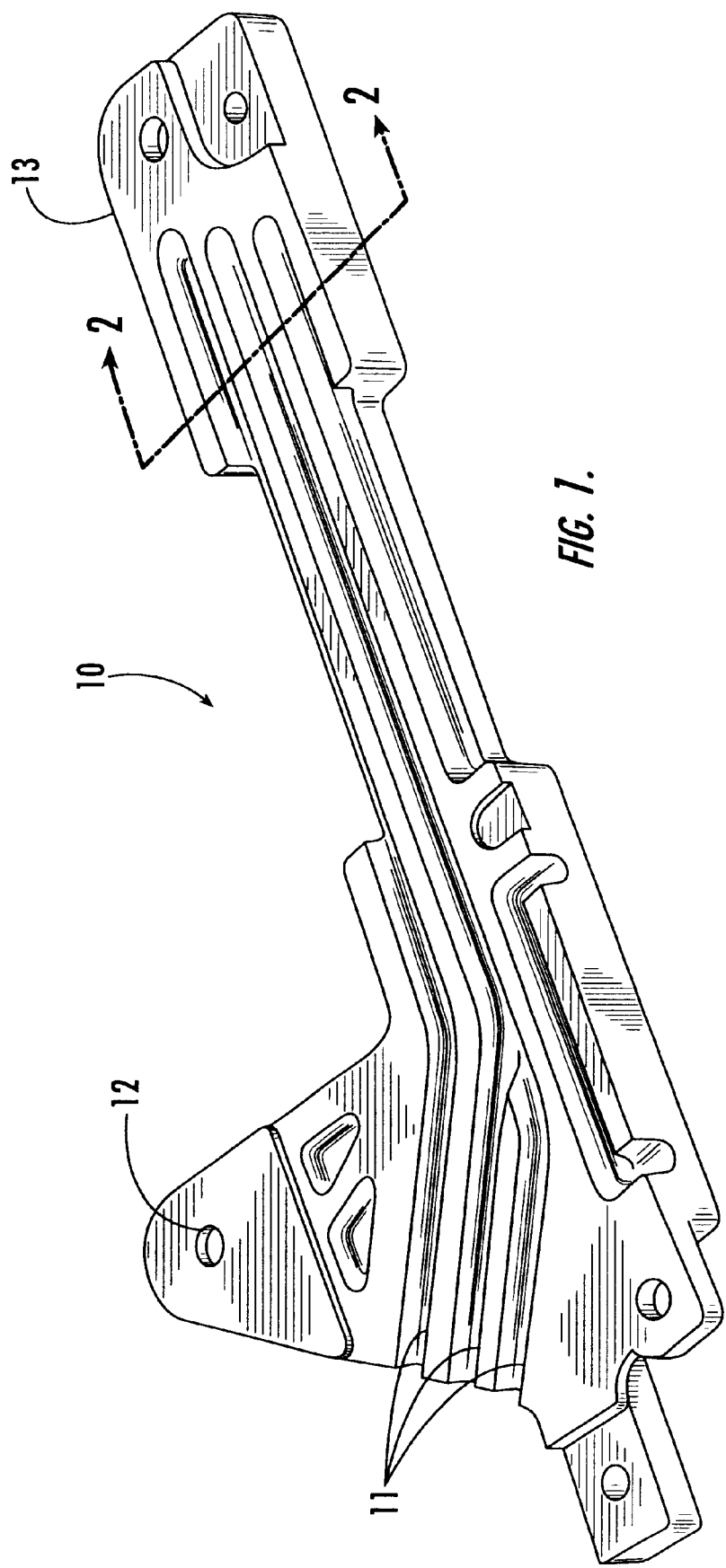
FIG. 1 is a perspective view of the heat component part of the present invention.

Referring to FIG. 1, a perspective view of a sample net-shape molded heat transfer part 10 with an EMI coating 13 of the present invention is shown. The net-shape molded part 10 includes air flow grooves 11 and mounting holes 12 therethrough, which can be molded directly into the part rather than machining them in a subsequent step as in the prior art. Alternately, these mounting holes 12 may be drilled.

Figure 2:
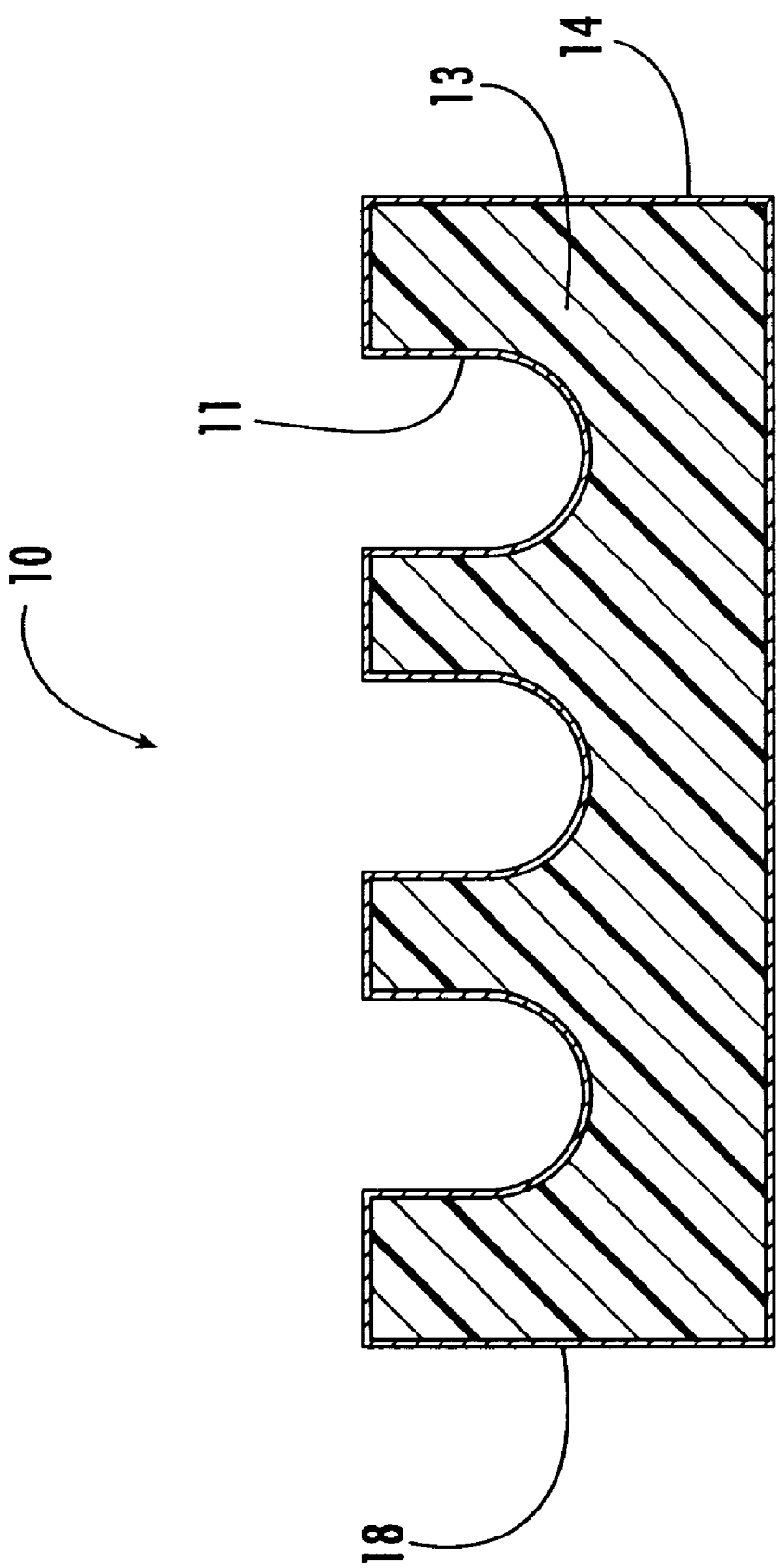
FIG. 2 is a cross-sectional view through the line 2—2 of FIG. 1.
Figure 3:
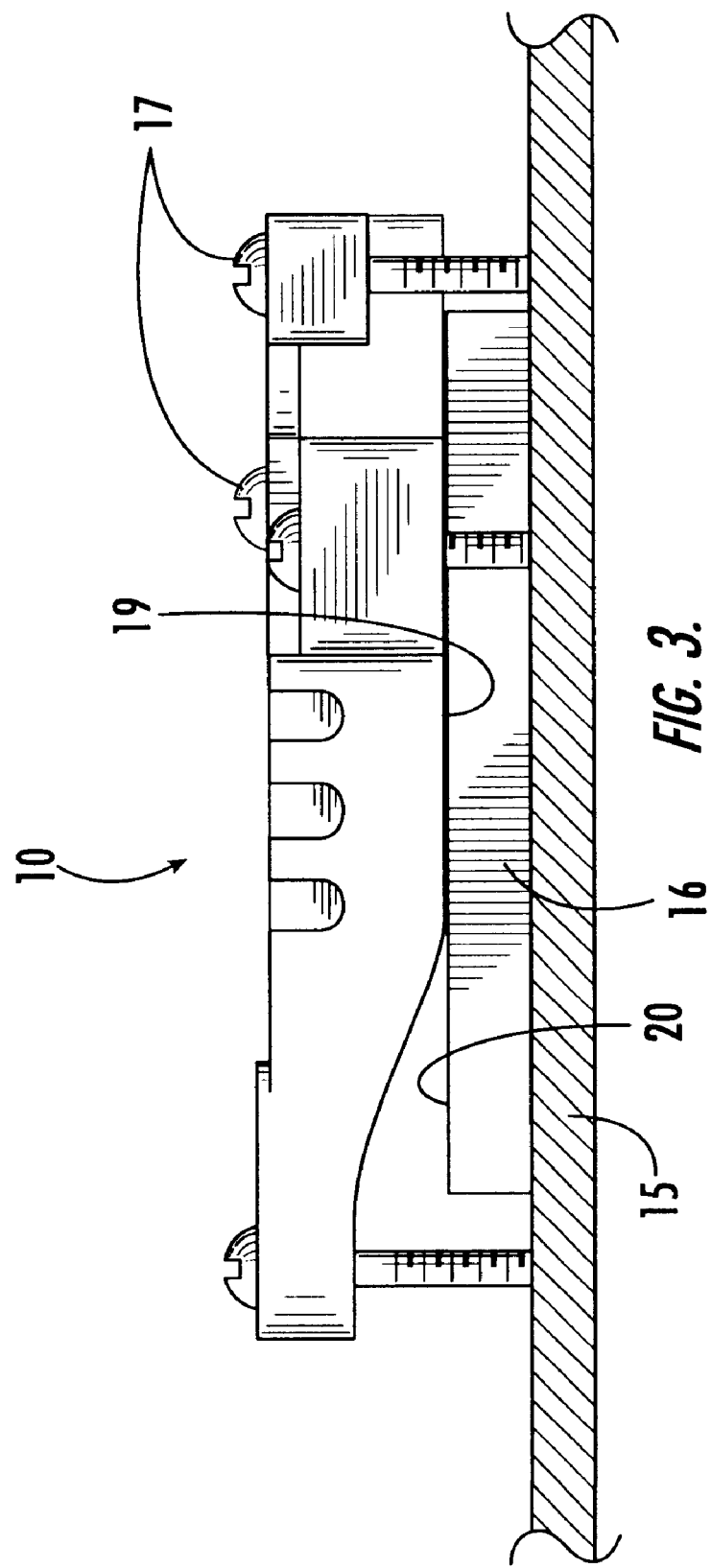
FIG. 3 is a side elevational view of the thermally conductive part of FIG. 1 in thermal communication with a heat-generating device.

In FIG. 2, a cross-sectional view of the molded heat transfer part 10 of the present invention is shown while FIG. 3 illustrates a side elevational view of the part mounted 10 on a device 16 to be cooled. As best seen in FIG. 2, the molded heat transfer part 10 includes a heat conductive polymer core 13. An EMI and RF reflective coating 14 is applied, preferably on the entire outer surface 18 of the part. The molded heat transfer part 10 is net-shape molded, such as by injection molding, into a unitary structure from thermally conductive material, such as a thermally conductive polymer composition. The thermally conductive polymer composition includes a base polymer of, for example, a liquid crystal polymer that is loaded with a conductive filler material, such as copper flakes or carbon fiber (not shown). Carbon fiber is preferred because it cannot transfer electricity yet is still highly thermally conductive. Details of the polymer composition itself are not shown as they are well known in the art. The EMI and RF reflective coating 14 is preferably nickel-copper. Other base materials and reflective coatings may be used and still be within the scope of the present invention. Also, the heat transfer part 10 of the present invention is net-shape molded which means that after molding it is ready for use and does not require additional machining or tooling to achieve the desired configuration of the part 10.

As described above, the ability to injection mold a thermally conductive part 10 rather than machine it has many advantages. As can be seen in FIGS. 1 and 2, grooves 11 increase the surface area of the part 10 available for heat transfer, and mounting holes 12, can be molded into the part 10 in a one-step process to facilitate mountintg to an object to be cooled. This is followed by a simple plating process to add the reflective coating 14 to the surface of the entire part 10. The figures illustrate one of many embodiments of the invention where a thermally conductive composition is net-shape molded into a thermally conductive heat transfer part 10. The configuration shown in the figures is by way of example. Other configurations can be employed and still be within the scope of the present invention.

As shown in FIG. 3, the installation of the heat transfer part 10 of the present invention onto a heat generating integrated circuit device 15 is shown, by way of example. The circuit board 15 includes a semiconductor device 16 mounted thereon that runs hot and is need of heat dissipation to avoid failure. The bottom side 19 of the heat transfer part 10 is positioned in flush thermal communication with the top surface 20 of semiconductor device 16. Fasteners 17, such as threaded screws, engage with circuit board 15 to secure the heat transfer part 10, via apertures 12, in thermal transfer relationship with the top side 20 of semiconductor device 16. Other different types of fasteners 17 and connection methods may be employed for this purpose, such as spring clips (not shown).

The reflective coating 14 on the part is employed to prevent absorption of EMI and RF waves by the heat transfer part 10 that could then be conducted back to the semiconductor 16 over the same pathway by which heat is dissipated. This embodiment of the present invention is particularly well suited for use in telecommunications applications where the heat transfer part 10 is subjected to constant bombardment by EMI and RF waves that could cause malfunction or failure of the very semiconductor 16 it was installed to cool and protect.

It should be understood that the application shown in FIG. 3 is merely an example of the many different applications of the present invention and is for illustration purposes only. The heat transfer part 10 could be fabricated in many shapes for incorporation into or housings for telecommunication applications by a modified embodiment in accordance with the present invention and may be modified to cool a wide array of heat generating objects.

In accordance with the present invention, a net-shape molded heat transfer part 10 is disclosed that is easy and inexpensive to manufacture and provides thermal transfer that is superior to prior art metal-machined heat transfer parts and device casings. In addition, the part 10 includes shielding capability that further protects the device, to which it is connected, from the deleterious effects of EMI and RF waves.

It would be appreciated by those skilled in the art that various changes and modifications can be made to the illustrated embodiments without departing from the spirit of the present invention. All such modifications and changes are intended to be covered by the appended claims.

What is claimed:

1. A net-shape molded heat transfer part, comprising:

a core of thermally conductive polymer material, said polymer material comprising a base matrix and a thermally conductive flakes of copper material randomly loaded therein, said thermally conductive copper flakes increasing the overall thermal conductivity through said core, said core having an outer surface; the thermally conductive flakes of copper material being capable of conducting heat through the core of thermally conductive polymer material; and a metallic coating disposed on and completely covering said entire outer surface of said core.

2. The net-shape molded heat transfer part of claim 1, wherein said metallic coating is an electromagnetic interference reflective coating.

3. The net-shape molded heat transfer part of claim 1, wherein said metallic coating is a radio frequency wave reflective coating.

4. The net-shape molded heat transfer part of claim 1, wherein said metallic coating is a copper-nickel coating.

5. A net-shape molded heat transfer part, comprising:

a core of thermally conductive polymer material, said polymer material comprising a base matrix and thermally conductive fiber of carbon material randomly loaded therein, said thermally conductive carbon material increasing the overall thermal conductivity through said core, said core having an outer surface; the thermally conductive fiber of carbon material being capable of conducting heat through the core of thermally conductive polymer material; and a metallic coating disposed on and completely covering said entire outer surface of said core.

6. The net-shape molded heat transfer part of claim 5, wherein said metallic coating is an electromagnetic interference reflective coating.

7. The net-shape molded heat transfer part of claim 5, wherein said metallic coating is a radio frequency wave reflective coating.

8. The net-shape molded heat transfer part of claim 5, wherein said metallic coating is a copper-nickel coating.

* * * * *